United States Patent
Matsumoto

(10) Patent No.: US 9,871,097 B2
(45) Date of Patent: Jan. 16, 2018

(54) THIN FILM TRANSISTOR, METHOD FOR MANUFACTURING THIN FILM TRANSISTOR, AND ORGANIC EL DISPLAY DEVICE

(71) Applicant: JOLED INC., Chiyoda-ku, Tokyo (JP)

(72) Inventor: Mitsutaka Matsumoto, Kyoto (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/320,319

(22) PCT Filed: Jun. 17, 2015

(86) PCT No.: PCT/JP2015/003042
§ 371 (c)(1),
(2) Date: Dec. 19, 2016

(87) PCT Pub. No.: WO2015/194176
PCT Pub. Date: Dec. 23, 2015

(65) Prior Publication Data
US 2017/0148924 A1    May 25, 2017

(30) Foreign Application Priority Data
Jun. 20, 2014  (JP) .................... 2014-127485

(51) Int. Cl.
*H01L 21/425*  (2006.01)
*H01L 21/02*   (2006.01)
(Continued)

(52) U.S. Cl.
CPC .......... *H01L 29/0607* (2013.01); *H01L 29/36* (2013.01); *H01L 33/508* (2013.01)

(58) Field of Classification Search
CPC .................... H01L 29/0607; H01L 33/508
(Continued)

(56) References Cited

U.S. PATENT DOCUMENTS 8,431,955 B2 *  4/2013  Anderson ............. G06F 17/505
                                                        257/102
2010/0051940 A1   3/2010  Yamazaki et al.
(Continued)

FOREIGN PATENT DOCUMENTS

JP    2010-80947 A    4/2010
JP    2010-161227 A   7/2010
(Continued)

OTHER PUBLICATIONS

International Search Report in International Patent Application No. PCT/JP2015/003042, dated Aug. 11, 2015.
(Continued)

*Primary Examiner* — Calvin Lee
(74) *Attorney, Agent, or Firm* — Hauptman Ham, LLP

(57) ABSTRACT

A thin film transistor includes: a gate electrode; a gate insulating layer above the gate electrode; an oxide semiconductor layer disposed above the gate insulating layer; and a source electrode and a drain electrode disposed above the oxide semiconductor layer and electrically connected to the oxide semiconductor layer, wherein metallic elements included in the oxide semiconductor layer include at least indium (In), fluorine is included in a region which is an internal region in the oxide semiconductor layer and is close to the gate insulating layer, and a fluorine concentration of the region close to the gate insulating layer in the oxide semiconductor layer is higher than a fluorine of a contact region for the source electrode or the drain electrode in the oxide semiconductor layer.

17 Claims, 14 Drawing Sheets

(51) Int. Cl.
*H01L 29/06* (2006.01)
*H01L 29/36* (2006.01)
*H01L 33/50* (2010.01)

(58) Field of Classification Search
USPC .............................. 257/611, 656; 438/517
See application file for complete search history.

(56) References Cited

U.S. PATENT DOCUMENTS

| | | |
|---|---|---|
| 2011/0073856 A1 | 3/2011 | Sato et al. |
| 2011/0089416 A1 | 4/2011 | Yamazaki et al. |
| 2011/0215331 A1 | 9/2011 | Yamazaki et al. |
| 2012/0122277 A1 | 5/2012 | Yamazaki et al. |
| 2014/0138683 A1 | 5/2014 | Yamazaki et al. |
| 2015/0050774 A1 | 2/2015 | Yamazaki et al. |
| 2015/0079731 A1 | 3/2015 | Yamazaki et al. |
| 2016/0079439 A1 | 3/2016 | Yamazaki et al. |

FOREIGN PATENT DOCUMENTS

| | | |
|---|---|---|
| JP | 2011-109078 A | 6/2011 |
| JP | 2011-205081 A | 10/2011 |
| WO | 2011/39853 A1 | 4/2011 |

OTHER PUBLICATIONS

Hideyuki Omura et al., "First-principles study of native point defects in crystalline indium gallium zinc oxide", Journal of Applied Physics, May 8, 2009, pp. 093712-1 to 093712-7, vol. 105, American Institute of Physics, N.Y., U.S.A.

Haruka Yamazaki et al., "Highly Realiable a-IGZO-TFTs with $SIN_x$ Gate Insulator deposited by $Sif_4/N_2$", AM-FPD '12, P-22, 2012, pp. 163-166, Japan.

\* cited by examiner (a)

(b) NF₃

(c)

(d)

THIN FILM TRANSISTOR, METHOD FOR MANUFACTURING THIN FILM TRANSISTOR, AND ORGANIC EL DISPLAY DEVICE

RELATED APPLICATIONS

The present application is a National Phase entry of International Application No. PCT/JP2015/003042, filed Jun. 17, 2015, which claims priority of Japanese Application No. 2014-127485, filed Jun. 20, 2014.

TECHNICAL FIELD

The present invention relates to a thin film transistor (TFT), a method for manufacturing the thin film transistor, and an organic EL display device, and in particular to an oxide semiconductor thin film transistor having an oxide semiconductor layer in an active layer, a method for manufacturing the oxide semiconductor thin film transistor, and an organic EL display device including an oxide semiconductor thin film transistor.

BACKGROUND ART

Active matrix display devices such as liquid crystal display devices and organic electroluminescent (EL) display devices use TFTs as switching elements or driver elements.

In recent years, active development has been conducted on, as next-generation TFTs, oxide semiconductor TFTs which use an oxide semiconductor such as $InGaZnO_x$ (IGZO) for channel layers. For example, Patent Literature (PTL) 1 discloses an oxide semiconductor TFT having an oxide semiconductor layer as a channel layer.

CITATION LIST

Patent Literature

[PTL 1]
Japanese Unexamined Patent Application Publication No. 2010-161227
[PTL 2]
Japanese Unexamined Patent Application Publication No. 2010-80947

Non Patent Literature

[NPL 1]
Hideyuki Omura, Hideya Kumomi, Kenji Nomura, Toshio Kamiya, Masahiro Hirano and Hideo Hosono, "First-principles study of native point defects in crystalline indium gallium zinc oxide", J. Appl. Phys. 105, pp. 093712-093719, 2009
[NPL 2]
Haruka Yamazaki, Mami Fujii, Yoshihiro Ueoka, Yasuaki Ishikawa, Masaki Fujiwara, Eiji Takahashi, and Yukiharu Uraoka, "Highly Reliable a-IGZO TFTs with SiNx Gate Insulator deposited by SiF4/N2", AM-FPD P-22 (2012)

SUMMARY OF INVENTION

Technical Problem

The electrical characteristics of oxide semiconductor TFTs are susceptible to oxygen or hydrogen (see NPL 1, for example). For this reason, it has been difficult to obtain oxide semiconductor TFTs having high reliability.

The present invention has been conceived to solve such a problem, and an object of the present invention is to provide a thin film transistor having high reliability.

Solution to Problem

In order to achieve the above object, a thin film transistor according to an aspect of the present invention includes: a gate electrode; a gate insulating layer disposed above the gate electrode; an oxide semiconductor layer disposed above the gate insulating layer; and a source electrode and a drain electrode electrically connected to the oxide semiconductor layer, wherein metallic elements included in the oxide semiconductor layer include at least indium, fluorine is included in a region which is an internal region in the oxide semiconductor layer and is close to the gate insulating layer, and a fluorine concentration of the region close to the gate insulating layer in the oxide semiconductor layer is higher than a fluorine concentration of a contact region for the source electrode or the drain electrode in the oxide semiconductor layer.

Advantageous Effects of Invention

The present invention allows a thin film transistor to be less susceptible to oxygen or hydrogen, thereby achieving the thin film transistor having high reliability.

DESCRIPTION OF EMBODIMENTS

Figure 1:
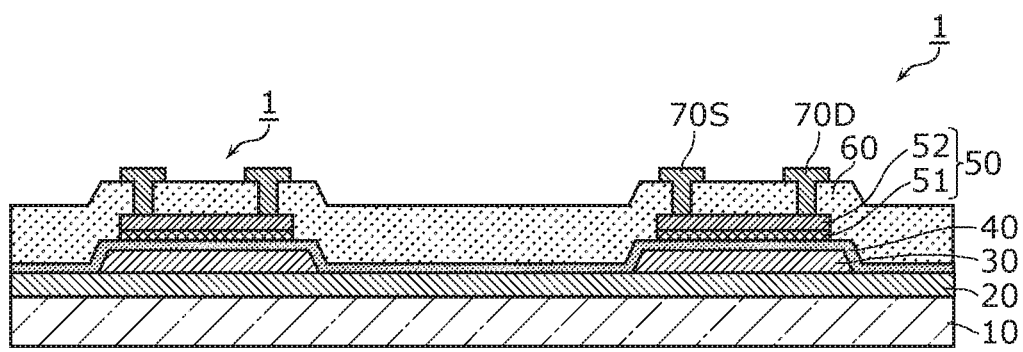
FIG. 1 is a cross-sectional view illustrating a structure of a thin film transistor according to an embodiment.

A thin film transistor according to an aspect of the present invention includes: a gate electrode; a gate insulating layer disposed above the gate electrode; an oxide semiconductor layer disposed above the gate insulating layer; and a source electrode and a drain electrode electrically connected to the oxide semiconductor layer, wherein metallic elements included in the oxide semiconductor layer include at least indium, fluorine is included in a region which is an internal region in the oxide semiconductor layer and is close to the gate insulating layer, and a fluorine concentration of the region close to the gate insulating layer in the oxide semiconductor layer is higher than a fluorine concentration of a contact region for the source electrode or the drain electrode in the oxide semiconductor layer.

According to the aspect of the present invention, fluorine is included in the oxide semiconductor layer, and the region in which fluorine is included (region including fluorine) in the oxide semiconductor layer has a fluorine concentration gradient in a thickness direction.

Fluorine has higher binding energy with metal than oxygen. Accordingly, including fluorine in the oxide semiconductor layer enables fluorine to eliminate dangling bonds or an unstable site caused by oxygen deficiency in the oxide semiconductor layer. In other words, including fluorine in the oxide semiconductor layer makes it possible to compensate the oxygen deficiency in the oxide semiconductor layer.

Moreover, including fluorine in the oxide semiconductor layer prevents hydrogen entering the oxide semiconductor layer from bonding with the oxide semiconductor layer. With this, it is possible to prevent hydrogen from entering the oxide semiconductor layer, thereby suppressing generation of charge carriers resulting from bonding of oxygen and hydrogen in the oxide semiconductor layer. In short, including fluorine in the oxide semiconductor layer makes it possible to improve hydrogen resistance of the oxide semiconductor layer.

Furthermore, including fluorine in the oxide semiconductor layer results in the metallic elements included in the oxide semiconductor layer being chemically bonded with fluorine, which makes it possible to stabilize a structure of the oxide semiconductor layer.

In the aspect of the present invention, fluorine is included in the region which is the internal region in the oxide semiconductor layer and is close to the gate insulating layer. In other words, fluorine is included in a front channel region in the oxide semiconductor layer. With this, the front channel region in the oxide semiconductor layer can be made less susceptible to damage resulting from hydrogen or oxygen, and a structure of the oxide semiconductor layer can be stabilized. Accordingly, it is possible to obtain the oxide semiconductor layer having the stable channel region.

In addition, in the aspect of the present invention, the fluorine concentration of the region close to the gate insulating layer in the oxide semiconductor layer is higher than the fluorine concentration of the contact region for the source electrode or the drain electrode in the oxide semiconductor layer. With this, resistance on a back channel side can be lower than resistance on the front channel side in the oxide semiconductor layer. In other words, contact resistance of a source contact portion and a drain contact portion in the oxide semiconductor layer can be reduced.

As just described, according to the aspect of the present invention, it is possible to both stabilize the channel region and reduce the contact resistance in the oxide semiconductor layer, thereby achieving the thin film transistor having high reliability.

Moreover, in the thin film transistor according to the aspect of the present invention, in the region including fluorine in the oxide semiconductor layer, a fluorine concentration of a region on a side of the gate insulating layer may be higher than a fluorine concentration of a region on a side opposite the gate insulating layer.

According to the aspect of the present invention, in the region including fluorine in the oxide semiconductor layer, the fluorine concentration of the region on the side of the gate insulating layer is higher than the fluorine concentration of the region on the side opposite the gate insulating layer. With this, in the oxide semiconductor layer, not only a more stable channel region can be achieved, but also the contact resistance of the source contact portion and the drain contact portion can be further reduced.

Moreover, in the thin film transistor according to the aspect of the present invention, the fluorine concentration of the region including fluorine in the oxide semiconductor layer may gradually increase toward the gate insulating layer.

According to the aspect of the present invention, it is possible to both stabilize the channel region and reduce the contact resistance in the oxide semiconductor layer.

Moreover, in the thin film transistor according to the aspect of the present invention, the region including fluorine in the oxide semiconductor layer may have a film thickness of at least 5 nm.

According to the aspect of the present invention, it is possible to sufficiently exert the aforementioned effects of including fluorine.

Moreover, in the thin film transistor according to the aspect of the present invention, the region including fluorine in the oxide semiconductor layer may have a film thickness of at least 20 nm.

Annealing may be performed with the aim of stabilizing characteristics of the oxide semiconductor layer, but this annealing may diffuse hydrogen and hydrogen may enter the oxide semiconductor layer. In response, even if the annealing or the like diffuses hydrogen, setting the film thickness of the region including fluorine in the oxide semiconductor layer enables the region including fluorine in the oxide semiconductor layer to prevent hydrogen from entering the oxide semiconductor layer.

Moreover, in the thin film transistor according to the aspect of the present invention, a fluorine concentration of the oxide semiconductor layer may be higher than at least a hydrogen concentration of the oxide semiconductor layer.

According to the aspect of the present invention, it is possible to sufficiently exert the aforementioned effects of including fluorine.

Moreover, in the thin film transistor according to the aspect of the present invention, the metallic elements included in the oxide semiconductor layer may further include at least one or both of gallium and zinc.

According to the aspect of the present invention, target compatibility with large mass production facilities is increased, and thus production costs can be reduced.

Moreover, the thin film transistor according to the aspect of the present invention may further include a protective layer formed on the oxide semiconductor layer.

According to the aspect of the present invention, it is possible to reduce process damage on a back channel side of the oxide semiconductor layer (channel layer).

Moreover, a method for manufacturing a thin film transistor according to an aspect of the present invention includes: forming a gate electrode; forming a gate insulating layer above the gate electrode; forming an oxide semiconductor layer including fluorine above the gate insulating layer; and forming a source electrode and a drain electrode above the oxide semiconductor layer to be electrically connected to the oxide semiconductor layer, wherein metallic elements included in the oxide semiconductor layer include at least indium, fluorine is included in a region which is an internal region in the oxide semiconductor layer and is close to the gate insulating layer, and a fluorine concentration of the region close to the gate insulating layer in the oxide semiconductor layer is higher than a fluorine concentration of a contact region for the source electrode or the drain electrode in the oxide semiconductor layer.

According to the aspect of the present invention, it is possible to form the oxide semiconductor layer capable of stabilizing a channel region and reducing contact resistance, thereby manufacturing a thin film transistor having high reliability.

Moreover, in the method according to the aspect of the present invention, in the region including fluorine in the oxide semiconductor layer, a fluorine concentration of a region on a side of the gate insulating layer may be higher than a fluorine concentration of a region on a side opposite the gate insulating layer.

According to the aspect of the present invention, in the oxide semiconductor layer, not only a more stable channel region can be achieved, but also contact resistance of a source contact portion and a drain contact portion can be further reduced.

Moreover, in the method according to the aspect of the present invention, the fluorine concentration of the region including fluorine in the oxide semiconductor layer may gradually increase toward the gate insulating layer.

According to the aspect of the present invention, it is possible to both stabilize the channel region and reduce the contact resistance in the oxide semiconductor layer.

Moreover, in the method according to the aspect of the present invention, fluorine may be introduced into the oxide semiconductor layer using a gas including fluorine.

According to the aspect of the present invention, providing the gas including fluorine makes it possible to deposit the oxide semiconductor layer in which fluorine is included.

Moreover, in the method according to the aspect of the present invention, the region including fluorine in the oxide semiconductor layer may have a film thickness of at least 5 nm.

According to the aspect of the present invention, it is possible to obtain the thin film transistor which is capable of sufficiently exerting the aforementioned effects of including fluorine.

Moreover, in the method according to the aspect of the present invention, the region including fluorine in the oxide semiconductor layer may have a film thickness of at least 20 nm.

According to the aspect of the present invention, even if annealing or the like diffuses hydrogen, the region including fluorine in the oxide semiconductor layer is capable of preventing hydrogen from entering the oxide semiconductor layer. In addition, setting the film thickness of the region including fluorine to be at least 20 nm makes it possible to sufficiently perform process control of the oxide semiconductor layer.

Moreover, in the method according to the aspect of the present invention, a fluorine concentration of the oxide semiconductor layer may be higher than at least a hydrogen concentration of the oxide semiconductor layer.

According to the aspect of the present invention, it is possible to obtain the thin film transistor which is capable of sufficiently exerting the aforementioned effects of including fluorine.

Moreover, in the method according to the aspect of the present invention, the metallic elements included in the oxide semiconductor layer may further include at least one or both of gallium and zinc.

According to the aspect of the present invention, target compatibility with large mass production facilities is increased, and thus production costs can be reduced.

Moreover, an organic EL display device according to an aspect of the present invention includes any of the aforementioned thin film transistors, the organic EL display device including: pixels arranged in a matrix; and organic elements each formed corresponding to a different one of the pixels, wherein the thin film transistor is a driving transistor which drives the organic EL elements.

According to the aspect of the present invention, the thin film transistor having high reliability is used as the driving transistor which drives the organic EL elements, thereby achieving the organic EL display device having superior display performance.

Embodiment

The following describes an embodiment of the present invention with reference to the accompanying drawings. The embodiment described below is merely a preferred illustration of the present invention. Values, shapes, materials, components, arrangement and connection of the components, processes (steps), order of the processes, and the like shown in the following embodiment are merely illustrative and are not intended to limit the present invention. Therefore, among the components of the embodiment below, components not recited in any one of independent claims are described as arbitrary components.

The figures are schematic illustration and do not necessarily limit the present invention to that precisely shown. In the figures, the same reference sign is used to refer to substantially the same component, and description already set forth is may be omitted or simplified.

[Structure of Thin Film Transistor]

First, the following describes a thin film transistor 1 according to the embodiment of the present invention with reference to FIG. 1. FIG. 1 is a cross-sectional view illustrating a structure of a thin film transistor according to the embodiment of the present invention. It is to be noted that FIG. 1 illustrates two thin film transistors 1, and the two thin film transistors 1 have the same structure.

As illustrated by FIG. 1, the thin film transistor 1 according to the embodiment is a bottom gate oxide semiconductor TFT having an oxide semiconductor layer as a channel layer.

The thin film transistor 1 includes a substrate 10, an undercoat layer 20, a gate electrode 30, a gate insulating layer 40, an oxide semiconductor layer 50, a protective layer 60, a source electrode 70S, and a drain electrode 70D.

The following describes in detail each component of the thin film transistor 1 according to the embodiment.

The substrate 10 is a glass substrate made of a glass material such as quartz glass, alkali-free glass, and high heat-resistant glass. It is to be noted that the substrate 10 is not limited to the glass substrate and may be a resin substrate or the like. Moreover, the substrate 10 is not a rigid substrate but may be a flexible substrate including a single layer of a film material such as polymide, polyethylene terephthalate, and polyethylene naphthalate, or stacked layers of these.

The undercoat layer 20 is formed on the substrate 10. The undercoat layer 20 is formed to prevent impurities such as sodium and phosphorus included in the substrate 10 (glass substrate) or moisture permeated from the air from entering the gate electrode 30, the gate insulating layer 40, and the oxide semiconductor layer 50.

The undercoat layer 20 is a single layer insulating layer of an oxide insulating layer or a nitride insulating layer, or a stacked insulating layer including an oxide insulating layer and a nitride insulating layer. In one instance, a single layer film of silicon nitride ($SiN_x$), silicon oxide ($SiO_y$), silicon oxynitride ($SiO_yN_x$), or aluminum oxide ($AlO_x$), or stacked films of these can be used as the undercoat layer 20. The film thickness of the undercoat layer 20 is preferably set to be from 100 to 500 nm. It is to be noted that the undercoat layer 20 is not necessarily formed.

The gate electrode 30 is above the substrate 10 and is pattern-formed in a predetermined shape, on the undercoat layer 20. The gate electrode 30 is an electrode having a single layer structure or a stacked layer structure including a conductive material such as metal or an alloy thereof, and may include molybdenum (Mo), aluminum (Al), copper (Cu), tungsten (W), titanium (Ti), chrome (Cr), or molybdenum tungsten (MoW), for example. The film thickness of the gate electrode 30 is preferably set to be from 50 to 300 nm.

The gate insulating layer 40 is disposed above the gate electrode 30. In the embodiment, the gate insulating layer 40 is formed on the undercoat 20 to cover the gate electrode 30. The gate insulating layer 40 is disposed between the gate electrode 30 and the oxide semiconductor layer 50.

The undercoat layer 40 is a single layer insulating layer of an oxide insulating layer or a nitride insulating layer, or a stacked insulating layer including an oxide insulating layer and a nitride insulating layer. The gate insulating layer 40 is a single layer film of silicon oxide, silicon nitride, silicon oxynitride, tantalum oxide, or aluminum oxide, or stacked films of these. In the embodiment, the gate insulating layer 40 is a stacked film including a silicon oxide film and a silicon nitride film, for example. The film thickness of the insulating layer 40 can be designed by taking into consideration pressure resistance of the TFT or the like, and is preferably set to be from 50 to 500 nm, for example.

The oxide semiconductor layer 50 is used as a channel layer and disposed above the gate insulating layer 40 to oppose the gate electrode 30. In other words, the oxide semiconductor layer 50 is a semiconductor layer including a channel region opposing the gate electrode 30 with the gate insulating layer 40 between the channel region and the gate electrode 30. In the embodiment, the oxide semiconductor layer 50 is formed in a predetermined shape, on the gate insulating layer 40.

A transparent amorphous oxide semiconductor (TAOS) is used for the material of the oxide semiconductor layer 50, for example. Metallic elements included in the oxide semiconductor layer 50 preferably include at least indium (In) and further at least one or both of gallium (Ga) and zinc (Zn).

The oxide semiconductor layer 50 in the embodiment includes $InGaZnO_x$ (IGZO) that is an oxide including indium (In), gallium (Ga), and zinc (Zn).

Moreover, the oxide semiconductor layer 50 includes fluorine (F). Specifically, fluorine is included in a region that is an internal region in the oxide semiconductor layer 50 and is close to the gate insulating layer 40. In other words, fluorine is included in a front channel side of the oxide semiconductor layer 50. In addition, the region close to the gate insulating layer 40 in the oxide semiconductor layer 50 has a fluorine concentration higher than that of a contact region (region distant from the gate insulating layer 40) for the source electrode 70S or the drain electrode 70D in the oxide semiconductor layer 50.

It is to be noted that fluorine that is chemically bonded is included in the oxide semiconductor layer 50. Moreover, the region close to the gate insulating layer 40 in the oxide semiconductor layer 50 is, for example, a region having a thickness of about 30 nm in a thickness direction from an interface between the gate insulating layer 40 and the oxide semiconductor layer 50.

The oxide semiconductor layer 50 in the embodiment includes a first region (region including fluorine) 51 which is a region including fluorine, and a second region (region including no fluorine) 52 which is a region including no fluorine.

The first region 51 is an internal region in the oxide semiconductor layer 50 and a region (front channel region) on a side of the gate insulating layer 40 in the oxide semiconductor layer 50. In addition, the second region 52 is an internal region in the oxide semiconductor layer 50 and a region (back channel region) on a side opposite the gate insulating layer 40 in the oxide semiconductor layer 50. For example, when the middle of the film thickness of the oxide semiconductor layer 50 is a reference point, the first region 51 is a region (lower layer) below the middle of the film thickness of the oxide semiconductor layer 50, and the second region 52 is a region (upper layer) above the middle of the film thickness of the oxide semiconductor layer 50. As just described, in the embodiment, fluorine is included only in the region (first region 51) on the side of the gate insulating layer 40 in the oxide semiconductor layer 50.

In the embodiment, the first region 51 (region including fluorine) has a fluorine concentration gradient in the thickness direction. Specifically, in the first region 51, a region on the side of the gate insulating layer 40 has a fluorine concentration higher than that of a region on the side opposite the gate insulating layer 40. Moreover, in the embodiment, the fluorine concentration of the first region 51 gradually increases toward the gate insulating layer 40.

It is to be noted that although fluorine is included in part of the region in the oxide semiconductor layer 50 in the embodiment, if the fluorine concentration gradient is present in the thickness direction of the oxide semiconductor layer 50, fluorine may be included in the whole region of the oxide semiconductor layer 50. In short, the second region 52 may be unnecessary.

Moreover, the first region (region including fluorine) 51 may have a constant fluorine concentration. In other words, the second region 52 including no fluorine and the first region 51 including fluorine at the constant concentration may allow the oxide semiconductor layer 50 to have the fluorine concentration gradient in the thickness direction.

The first region 51 (region including fluorine) has a film thickness of at least 5 nm, and the film thickness of the first region 51 is set to be 20 nm or more in the embodiment. Moreover, the oxide semiconductor layer 50 preferably has a film thickness of 20 nm or more.

Setting the film thickness of the first region 51 to be 5 nm or more makes it possible to sufficiently exert the aforementioned effects of including fluorine.

Moreover, even when hydrogen diffuses in oxide semiconductor layer 50 by annealing or the like, setting the film thickness of the first region 51 to be 20 nm or more enables the first region 51 including fluorine to block diffusing hydrogen. In the embodiment, since the first region 51 is close to the gate insulating layer 40, hydrogen entering the oxide semiconductor layer 50 from the gate insulating layer 40 can be blocked by the region (first region 51) close to the gate insulating layer 40 in the oxide semiconductor layer 50.

Moreover, setting the film thickness of the first region 51 to be at least 20 nm makes it possible to sufficiently perform process control of the oxide semiconductor layer 50. In other words, the film thickness of the oxide semiconductor layer 50 can be set to be at least 20 nm by setting the film thickness of the first region 51 to be at least 20 nm. With this, it is possible to readily perform deposition of the oxide semiconductor layer 50 by sputtering or the like, and patterning of the oxide semiconductor layer 50 by a photolithography or etching method, for example.

Moreover, the oxide semiconductor layer 50 has a fluorine concentration higher than at least a hydrogen concentration of the oxide semiconductor layer 50. In the embodiment, the fluorine concentration of the oxide semiconductor layer 50 is set to be $1 \times 10^{22}$ atm/cm$^3$ or more.

The protective layer 60 is formed on the oxide semiconductor layer 50. The protective layer 60 is a channel region protective layer which protects the channel region in the oxide semiconductor layer 50, and serves as an etching stopper layer. With this, it is possible to reduce process damage on a back channel side of the oxide semiconductor layer 50 in the bottom gate TFT. Moreover, in the embodiment, the protective layer 60 is an interlayer insulating layer formed on the whole surface of the substrate 10.

The protective layer 60 may be made of a material having an organic substance as a main component or may be made of an inorganic substance such as silicon oxide, silicon nitride, silicon oxynitride, and aluminum oxide. In the embodiment, the protective layer 60 is made of a material having an organic substance as a main component. It is to be noted that the protective layer 60 may be a single layer film or a film having stacked layers.

It is to be noted that a silicon oxide film has a less amount of hydrogen than a silicon nitride film. Accordingly, using the silicon oxide film as the protective layer 60 makes it possible to reduce performance degradation of the oxide semiconductor layer 50 caused by hydrogen. In addition, using an oxide aluminum film as the protective layer 60 makes it possible to block hydrogen or oxygen generated in an upper layer with the oxide aluminum film. Judging from the above, for example, a stacked film having a three layer structure of the silicon oxide film, the oxide aluminum film, and the silicon oxide film is preferably used as the protective layer 60.

Moreover, in the protective layer 60, openings (contact holes) are formed to penetrate part of the protective layer 60. The oxide semiconductor layer 50 is connected to the source electrode 70S and the drain electrode 70D via the openings of the protective layer 60.

The source electrode 70S and the drain electrode 70D are disposed above the oxide semiconductor layer 50 and formed in a predetermined shape, on the protective layer 60, to be electrically connected to the oxide semiconductor layer 50.

The source electrode 70S and the drain electrode 70D have a top contact structure, and are electrically connected via the protective layer 60 to a source contact portion and a drain contact portion in the oxide semiconductor layer 50, respectively. Specifically, the source electrode 70S and the drain electrode 70D are connected to the oxide semiconductor layer 50 via the openings formed in the protective layer 60.

In the embodiment, the source electrode 70S and the drain electrode 70D are electrically connected to the oxide semiconductor layer 50 by being physically connected to the oxide semiconductor layer 50, but may be electrically connected to the oxide semiconductor layer 50 via another conductor layer or a semiconductor layer.

The source electrode 70S and the drain electrode 70D each are an electrode having a single layer structure including an conductive material or an alloy thereof, or a stacked layer structure of these. The source electrode 70S and the drain electrode 70D may include, for example, molybdenum (Mo), aluminum (Al), copper (Cu), tungsten (W), titanium (Ti), chrome (Cr), molybdenum tungsten alloy (MoW), or copper manganese allow (CuMN). The film thickness of the source electrode 70S and the drain electrode 70D is preferably set to be from 50 to 300 nm, for example.

[Method for Manufacturing Thin Film Transistor]

Next, the method for manufacturing the thin film transistor 1 according to the embodiment will be described with reference to FIGS. 2A to 2G. FIGS. 2A to 2G are cross-sectional views illustrating processes in the method for manufacturing the thin film transistor according to the embodiment of the present invention.

Figure 2A:
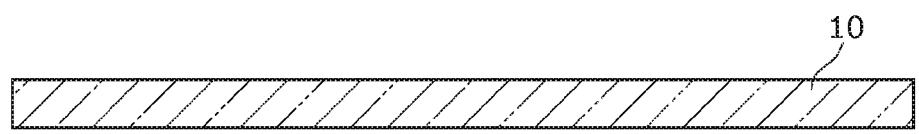
FIG. 2A is a cross-sectional view illustrating a process for preparing a substrate in a method for manufacturing the thin film transistor according to the embodiment.

First, as illustrated by FIG. 2A, the substrate 10 is prepared. It is to be noted that a glass substrate is used as the substrate 10, for example.

Figure 2B:
FIG. 2B is a cross-sectional view illustrating a process for forming an undercoat in the method for manufacturing the thin film transistor according to the embodiment.

Next, as illustrated by FIG. 2B, the undercoat layer 20 is formed on the substrate 10. The undercoat layer 20 including a silicon nitride film, a silicon oxide film, a silicon oxynitride film, an oxide aluminum film, or the like is formed on the substrate 10 by plasma chemical vapor deposition (CVD) or the like.

Figure 2C:
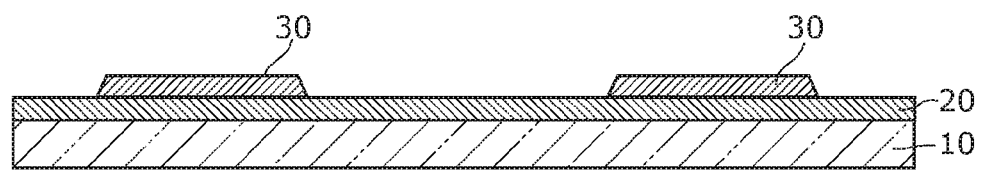
FIG. 2C is a cross-sectional view illustrating a process for forming a gate electrode in the method for manufacturing the thin film transistor according to the embodiment.

Next, as illustrated by FIG. 2C, the gate electrode 30 is formed above the substrate 10. In the embodiment, after a metal film (gate metal film) including molybdenum tungsten (MoW) is deposited on the undercoat layer 20 by sputtering, the gate electrode 30 is formed in a predetermined shape by patterning the metal film using a photolithography or wet etching method. For the wet etching of MoW, a chemical solution can be used which is obtained by mixing, for example, phosphoric acid ($HPO_4$), nitric acid ($HNO_3$), acetic acid ($CH_3COOH$), and water in a predetermined combination ratio.

Figure 2D:
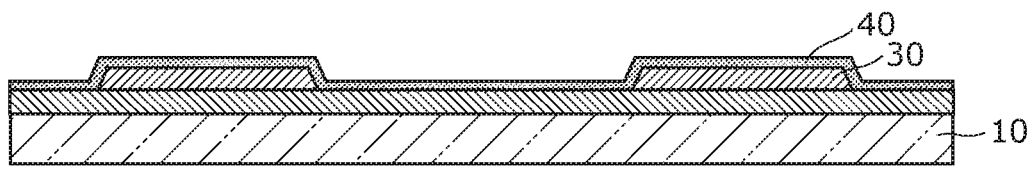
FIG. 2D is a cross-sectional view illustrating a process for forming a gate insulating layer in the method for manufacturing the thin film transistor according to the embodiment.

Next, as illustrated by FIG. 2D, the gate insulating layer 40 is formed above the gate electrode 30. For example, the gate insulating layer 40 is formed to be between the gate electrode 30 and the oxide semiconductor layer 50. In the embodiment, the gate insulating layer 40 is formed over the whole surface above the substrate 10 to cover the gate electrode 30, by plasma CVD or the like. The gate insulating layer 40 is a silicon nitride film, a silicon oxide film, a silicon oxynitride film, a tantalum oxide film, an oxide aluminum film, or stacked layers of these, for example. In one instance, when the silicon nitride film is deposited by a plasma CVD method, a silane gas ($SiH_4$), an ammonia gas ($NH_3$), and a nitrogen gas ($N_2$) are used as introduced gases for the deposition.

Figure 2E:
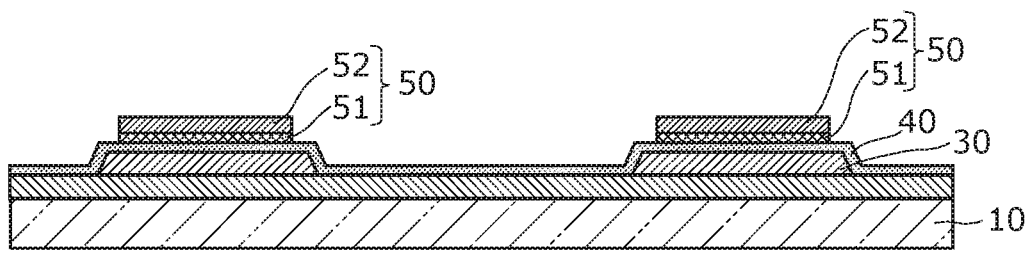
FIG. 2E is a cross-sectional view illustrating a process for forming an oxide semiconductor layer in the method for manufacturing the thin film transistor according to the embodiment.

Next, as illustrated by FIG. 2E, the semiconductor layer 50 including fluorine and having a predetermined shape is formed above the gate insulating layer 40 to oppose at least the gate electrode 30. The oxide semiconductor layer 50 including fluorine can be formed by introducing fluorine into the oxide semiconductor layer 50 using a gas ($NF_3$) including fluorine.

For example, after the oxide semiconductor layer 50 is deposited on the gate insulating layer 40, performing fluorine processing using fluorine enables fluorine to be included in the oxide semiconductor layer 50 so that the oxide semiconductor layer 50 has a concentration gradient. The oxide semiconductor layer 50 includes an $InGaZnO_x$ transparent amorphous oxide semiconductor. In this case, the oxide semiconductor layer 50 including $InGaZnO_x$ can be deposited by a vapor phase deposition method such as a sputtering method and a laser evaporation method.

Moreover, instead of introducing fluorine after the oxide semiconductor layer 50 is deposited, fluorine may be introduced into the oxide semiconductor layer 50 while the oxide semiconductor layer 50 is being deposited. In short, the oxide semiconductor layer 50 may be deposited while fluorine is being introduced therein. Even in this case, the oxide semiconductor layer 50 can be deposited in which fluorine is included so that the oxide semiconductor layer 50 has a concentration gradient.

Specifically, a target material including In, Ga, and Zn (for example, a polycrystalline sintered body having an $InGaO_3(ZnO)_4$ composition) is used, an argon (Ar) gas as an inert gas and a gas including oxygen ($O_2$) as a reactive gas are introduced into a vacuum chamber, and voltage of a predetermined power density is applied to the target material. With this, an $InGaZnO_x$ film can be deposited.

Here, to begin with, a first oxide semiconductor layer including fluorine (In—Ga—Zn—O:F) can be deposited by sputtering while introducing fluorine. The introduction (supply) of fluorine into the first oxide semiconductor layer can be performed by including fluorine in a target or introducing a process gas including fluorine ($NF_3$ gas, for example). Specifically, the first oxide semiconductor layer including fluorine can result from depositing the $InGaZnO_x$ film by sputtering using a target material including fluorine. Alternatively, the first oxide semiconductor layer including fluorine can result from depositing the $InGaZnO_x$ film using a gas including fluorine ($NF_3$ gas, for example). It is to be noted that it is possible to allow the first oxide semiconductor layer to have a fluorine concentration gradient by changing an introduction amount of fluorine while the first oxide semiconductor layer is being deposited.

Then, a second oxide semiconductor layer including no fluorine (In—Ga—Zn—O) is deposited by sputtering or the like without introducing (supplying) fluorine. It is to be noted that in the embodiment the first oxide semiconductor layer and the second oxide semiconductor layer are continuously deposited in the same chamber.

Then, the oxide semiconductor layer 50 having the predetermined shape can be formed by patterning, using a photolithography or wet etching method, the oxide semiconductor film having a stacked structure of the first oxide semiconductor layer and the second oxide semiconductor layer.

Specifically, first, a resist having a predetermined shape is formed on the oxide semiconductor film, and part of the oxide semiconductor film in a region where the resist is not formed is removed by wet etching, thereby forming the oxide semiconductor layer 50 having an island shape. It is to be noted that when the oxide semiconductor film includes $InGaZnO_x$, a chemical solution obtained by mixing, for example, phosphoric acid ($H_3PO_4$), nitric acid ($HNO_3$), acetic acid ($CH_3COOH$), and water may be used as an etching solution.

Figure 2F:
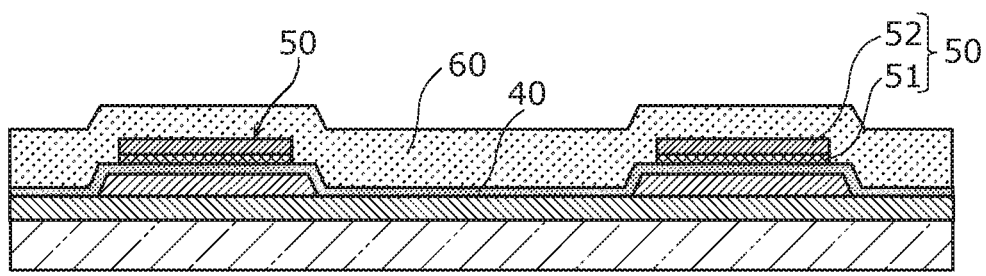
FIG. 2F is a cross-sectional view illustrating a process for forming a protective layer in the method for manufacturing the thin film transistor according to the embodiment.

Next, as illustrated by FIG. 2F, the protective layer 60 is formed on the gate insulating layer 40 to cover the oxide semiconductor layer 50. The protective layer 60 may include an organic substance as a main component or an inorganic substance such as a silicon oxide film.

Then, the openings (contact holes) are formed in the protective layer 60 to expose part of the oxide semiconductor layer 50. Specifically, part of the protective layer 60 is etched away by a photolithography or etching method, thereby forming the openings above connection portions with the source electrode 70S and the drain electrode 70D in the oxide semiconductor layer 50. For example, when the protective layer 60 is a silicon oxide film, the openings can be formed in the silicon oxide film by a dry etching method such as a reactive ion etching (RIE) method. In this case, carbon tetrafluoride ($CF_4$) and oxygen gas ($O_2$), for example, can be used as an etching gas.

Figure 2G:
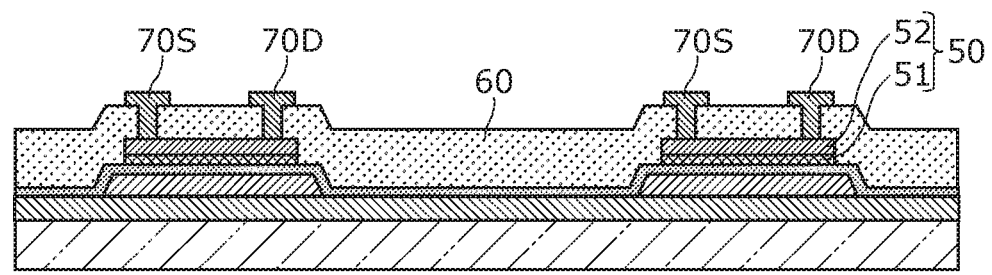
FIG. 2G is a cross-sectional view illustrating a process for forming a source electrode and a drain electrode in the method for manufacturing the thin film transistor according to the embodiment.

Next, as illustrated by FIG. 2G, the source electrode 70S and the drain electrode 70D are formed which are connected to the oxide semiconductor layer 50 via the openings formed in the protective layer 60. In the embodiment, after a metal film (source drain metal film) is deposited on the protective layer 60 by sputtering to fill the openings formed in the protective layer 60, the metal film is patterned by a photolithography or wet etching method to form the source electrode 70S and the drain electrode 70D having a predetermined shape.

It is to be noted that, though not illustrated, for example, a heat treatment at 300° C. (annealing) is performed subsequently. This heat treatment makes it possible to reduce oxygen deficiency in the oxide semiconductor layer 50 to stabilize characteristics of the oxide semiconductor layer 50.

[Operational Effect of Thin Film Transistor]

The following describes an operational effect of the thin film transistor 1 according to the embodiment together with the background to the present invention.

The electrical characteristics of oxide semiconductor TFTs including an oxide semiconductor layer are susceptible to oxygen or hydrogen. For this reason, the oxide semiconductor TFTs have a problem with stability and reliability.

As disclosed by PTL 2 and NPL 2, it has been previously reported that the stability and reliability can be increased by improving an interface between an insulating layer and an oxide semiconductor layer.

For example, NPL 2 has reported that fluorine is compensated in a dangling bond site of In included in an oxide semiconductor layer (IGZO) by improving an interface with the oxide semiconductor layer using a gate insulating layer in which fluorine is included, thereby leading to increase the reliability.

In addition, NPL 2 has reported that the oxide semiconductor layer (IGZO) is measured by secondary ion mass spectrometry (SIMS) to observe no fluorine included in a bulk of IGZO.

After the inventors also actually verified whether fluorine was diffused in an oxide semiconductor layer (IGZO) by heat or the like using an insulating layer in which fluorine is included, they were not able to confirm desorption of fluorine by a thermal desorption method until the temperature reaches 500° C. or higher. This indicates that fluorine has a stable structure in the oxide semiconductor layer, and as shown by NPL 2, it is considered that the gate insulating layer in which fluorine is included merely produces an improvement effect in the interface between the insulating layer and the oxide semiconductor layer.

However, variation in the characteristics or degradation of the reliability of an oxide semiconductor TFT is caused not only by an interface between an insulating layer and an oxide semiconductor layer but also by process damage resulting from hydrogen or the like in a manufacturing process. Therefore, it is not sufficient to merely improve the interface between the insulating layer and the oxide semiconductor layer.

The present invention has been conceived based on such knowledge, and the inventors have arrived at an idea of obtaining a thin film transistor having high reliability by including fluorine in the oxide semiconductor layer 50 as described above.

The inventors have conducted various experiments to verify whether a thin film transistor having high reliability is obtained by including fluorine in an oxide semiconductor layer. The following describes the experiments and analyses of the same. It is to be noted that in the following experiments an InGaZnO$_x$ film whose main components of metallic elements are In, Ga, and Zn is used as the oxide semiconductor layer 50.

Figure 3:
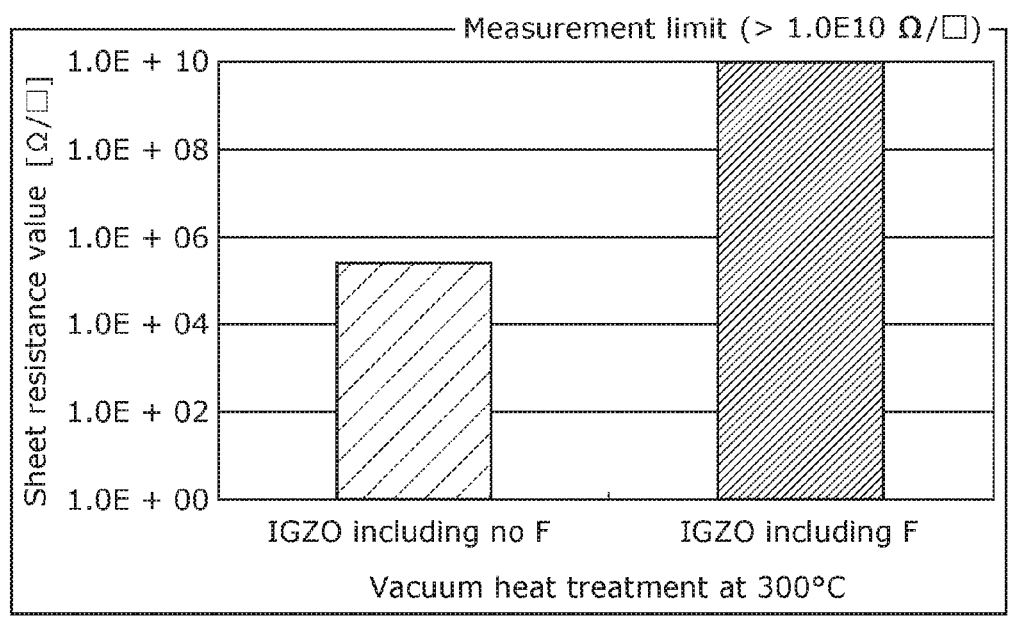
FIG. 3 is a graph illustrating the results of measuring a sheet resistance value in a case where fluorine is included in an oxide semiconductor layer, and a sheet resistance value in a case where fluorine is not included in the oxide semiconductor layer.

First, a point that oxygen deficiency can be compensated by including fluorine in the oxide semiconductor layer 50 will be described with reference to FIG. 3. FIG. 3 illustrates the results of measuring, using four-terminal sensing, a sheet value in vacuum heating (300° C.) for a case where fluorine is included in an oxide semiconductor layer and a case where fluorine is not included in the oxide semiconductor layer.

Charge carriers are generated by oxygen deficiency (desorption of oxygen) to decrease a resistance value of the oxide semiconductor layer 50. As illustrated by FIG. 3, a sheet resistance value in the case where fluorine is not included in the oxide semiconductor layer 50 (IGZO including no F) is low such as approximately $1 \times 10^5 \Omega/\square$.

By contrast, a sheet resistance value in the case where fluorine is included in the oxide semiconductor layer 50 (IGZO including F) is a measurement limit ($>1 \times 10^{10} \Omega/\square$) and is higher than the sheet resistance value in the case fluorine is not included in the oxide semiconductor layer 50.

This is because, since fluorine has higher binding energy with metal than oxygen, including fluorine in the oxide semiconductor layer 50 enables fluorine to eliminate dangling bonds or an unstable site caused by the oxygen deficiency in the oxide semiconductor layer 50.

It is clear from these results that including fluorine in the oxide semiconductor layer 50 results in a structure in which charge carriers are less likely to be generated, that is, a structure which compensates the oxygen deficiency to be insensitive to the oxygen deficiency.

Next, a point that hydrogen resistance can be improved by including fluorine in the oxide semiconductor layer 50 will be described with reference to FIGS. 4 to 6.

Figure 4:
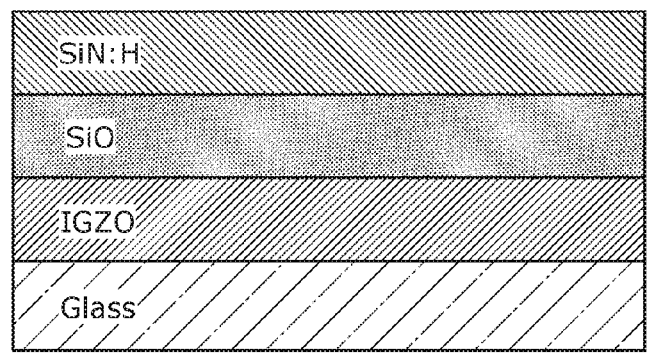
FIG. 4 is a cross-sectional view illustrating a device structure of a sample used in an experiment for hydrogen resistance.

FIG. 4 is a cross-sectional view illustrating a device structure of a sample used in this experiment. As illustrated by FIG. 4, in the experiment, a sample is used which has a three layer structure in which an oxide semiconductor layer (IGZO), a silicon oxide layer (SiO), and a silicon nitride layer (SiN:H) including hydrogen are stacked above a glass substrate.

Figure 5:
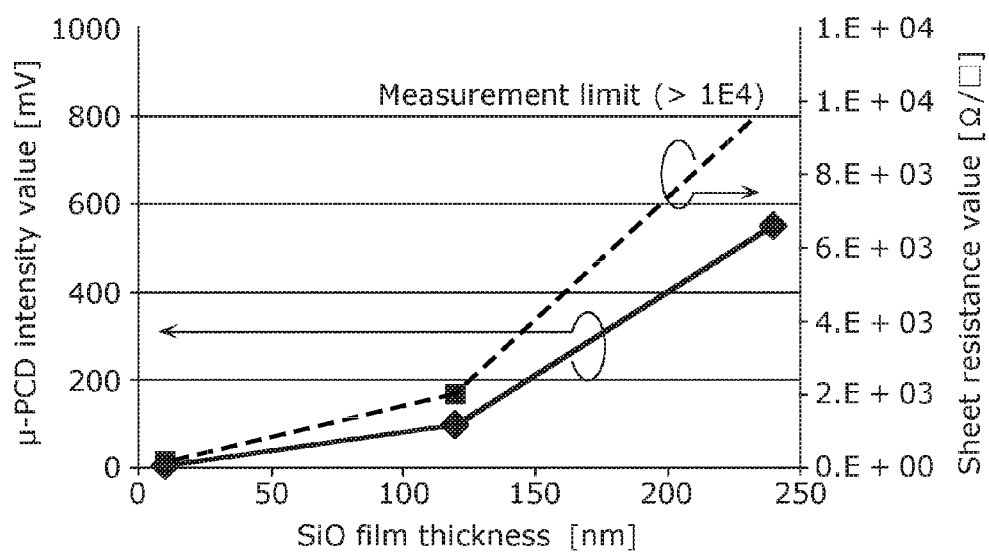
FIG. 5 is a graph illustrating, for the sample having the structure illustrated by FIG. 4, µ-PCD peak intensity and a resistance value of the oxide semiconductor layer when the film thickness of the silicon oxide layer is varied.

FIG. 5 is a graph illustrating, for the sample having the structure illustrated by FIG. 4, μ-PCD peak intensity and a resistance value of the oxide semiconductor layer when the film thickness of the silicon oxide layer is varied. It is to be noted that the film thickness of the silicon oxide layer is varied to 10 nm, 120 nm, and 240 nm. Moreover, the resistance value of the oxide semiconductor layer is measured by a non-contact resistance measurement device.

As illustrated by FIG. 5, it is clear that there is a positive correlation between the resistance value of the oxide semiconductor layer (IGZO) and the μ-PCD peak intensity. In other words, it is clear that the resistance value of the oxide semiconductor layer (IGZO) and the μ-PCD peak intensity give an indication of determining hydrogen-induced damage due to the presence or absence of fluorine introduction.

Figure 6:
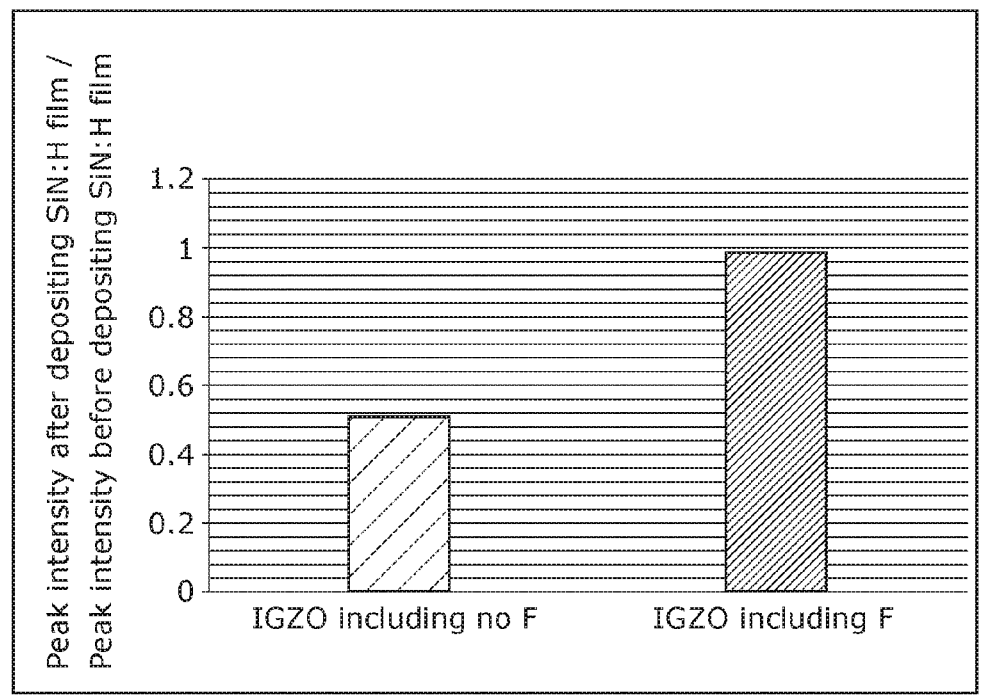
FIG. 6 is a graph illustrating the results of comparing μ-PCD peak intensity and the presence or absence of fluorine introduction into an oxide semiconductor layer.

FIG. 6 is a graph illustrating the results of comparing μ-PCD peak intensity and the presence or absence of fluorine introduction into an oxide semiconductor layer.

As illustrated by FIG. 6, it is clear that if fluorine is not included in the oxide semiconductor layer, a μ-PCD intensity value (a ratio of a peak intensity value before depositing SiN:H film to a peak intensity value after depositing SiN:H film) in the oxide semiconductor layer decreases. In other words, it is clear that a resistance value barely varies even if fluorine is introduced when the resistance value is low, that is, the resistance value does not decrease.

In general, if hydrogen is included in an oxide semiconductor layer, the included hydrogen bonds with oxygen in the oxide semiconductor layer to generate charge carriers.

In view of, even if hydrogen is included in the oxide semiconductor layer, including fluorine in the oxide semiconductor layer and bonding fluorine with the oxide semiconductor layer prevent the included hydrogen from bonding with the oxide semiconductor layer. It is presumed that since fluorine has one valence arm, there is no valence arm available even if hydrogen enters and hydrogen is inert. As just described, including fluorine in the oxide semiconductor layer can prevent the generation of the charge carriers in the oxide semiconductor layer. In short, including fluorine in the oxide semiconductor layer makes it possible to improve the hydrogen resistance.

Next, a point that a structure of the oxide semiconductor layer 50 is stabilized by including fluorine in the oxide semiconductor layer 50 will be described with reference to FIGS. 7A to 7C and FIG. 8.

Figure 7A:
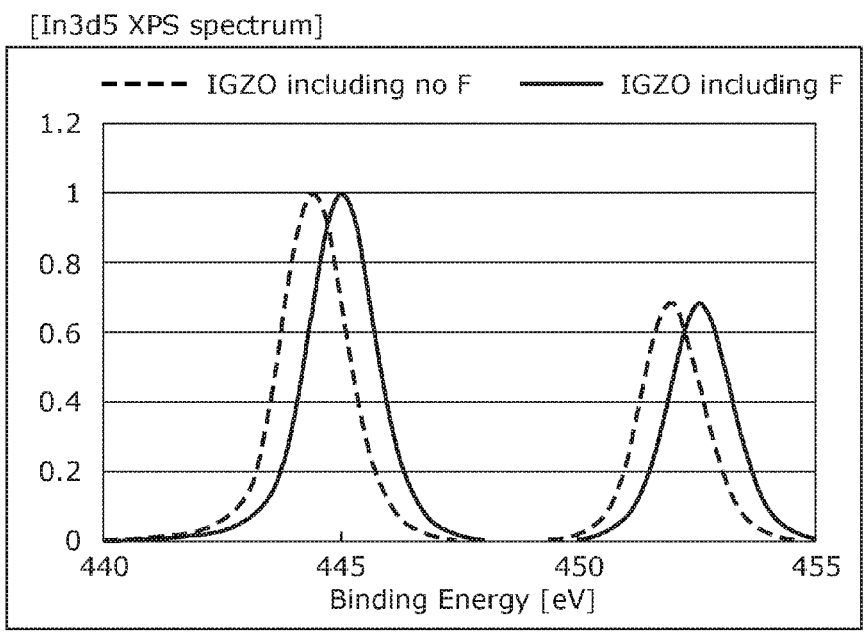
FIG. 7A is a graph illustrating an In3d5 XPS spectrum in a case where fluorine is included in an oxide semiconductor layer, and an In3d5 XPS spectrum in a case where fluorine is not included in the oxide semiconductor layer.
Figure 7B:
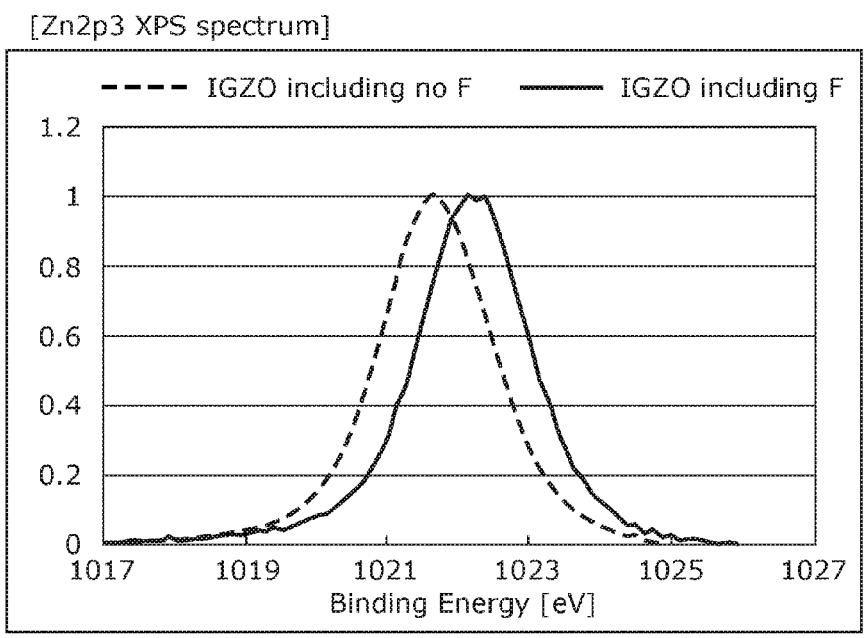
FIG. 7B is a graph illustrating a Zn2p3 XPS spectrum in a case where fluorine is included in an oxide semiconductor layer, and a Zn2p3 XPS spectrum in a case where fluorine is not included in the oxide semiconductor layer.
Figure 7C:
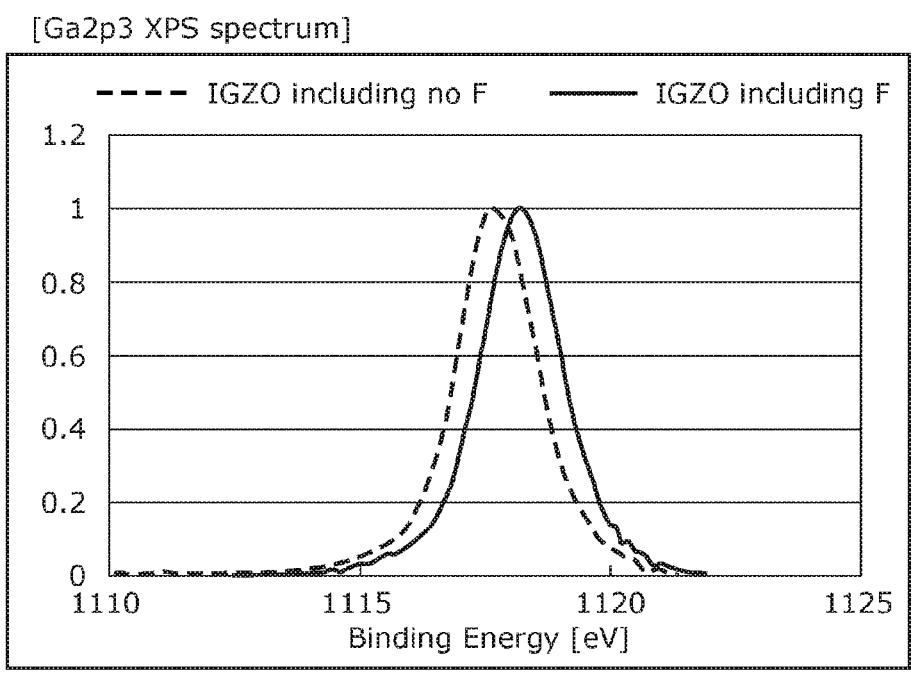
FIG. 7C is a graph illustrating a Ga2p3 XPS spectrum in a case where fluorine is included in an oxide semiconductor layer, and a Ga2p3 XPS spectrum in a case where fluorine is not included in the oxide semiconductor layer.

FIGS. 7A to 7C each illustrate a corresponding one of In3d5, Zn1p3, and Ga2p3 XPS spectra in a case where fluorine is included in an oxide semiconductor layer (IGZO) (IGZO including F) and a corresponding one of In3d5, Zn1p3, and Ga2p3 XPS spectra in a case where fluorine is not included in an oxide semiconductor layer (IGZO) (IGZO including no F).

As illustrated by FIG. 7A, the inclusion of fluorine causes a peak position of the In3d5 XPS spectrum to shift to a high binding energy side by at least 0.5 eV. In other words, a peak position of In3d5 in IGZO including F measured by XPS is shifted to the high binding energy side by at least 0.5 eV in comparison to a peak position of In3d5 in IGZO including no F.

Moreover, as illustrated by FIG. 7B, the inclusion of fluorine causes a peak position of the Zn2p3 XPS spectrum to shift to a high binding energy side by at least 0.4 eV. In other words, a peak position of Zn2p3 in IGZO including F measured by XPS is shifted to the high binding energy side by at least 0.4 eV in comparison to a peak position of Zn2p3 in IGZO including no F.

Furthermore, as illustrated by FIG. 7C, the inclusion of fluorine causes a peak position of the Ga2p3 XPS spectrum to shift to a high binding energy side by at least 0.5 eV. In other words, a peak position of Ga2p3 in IGZO including F measured by XPS is shifted to the high binding energy side by at least 0.5 eV in comparison to a peak position of Ga2p3 in IGZO including no F.

It is clear from the results shown in FIGS. 7A to 7C that including fluorine in the oxide semiconductor layer 50 results in not merely being physically in the oxide semiconductor layer 50 but in being chemically bonded with elements included in the oxide semiconductor layer. Consequently, the metallic elements included in the oxide semiconductor layer 50 are less likely to escape.

As just described, including fluorine in the oxide semiconductor layer 50 results in the metallic elements included in the oxide semiconductor layer 50 being chemically bonded with fluorine, which makes it possible to stabilize the structure of the oxide semiconductor layer 50. With this, it is possible to obtain a thin film transistor having high reliability.

Figure 8:
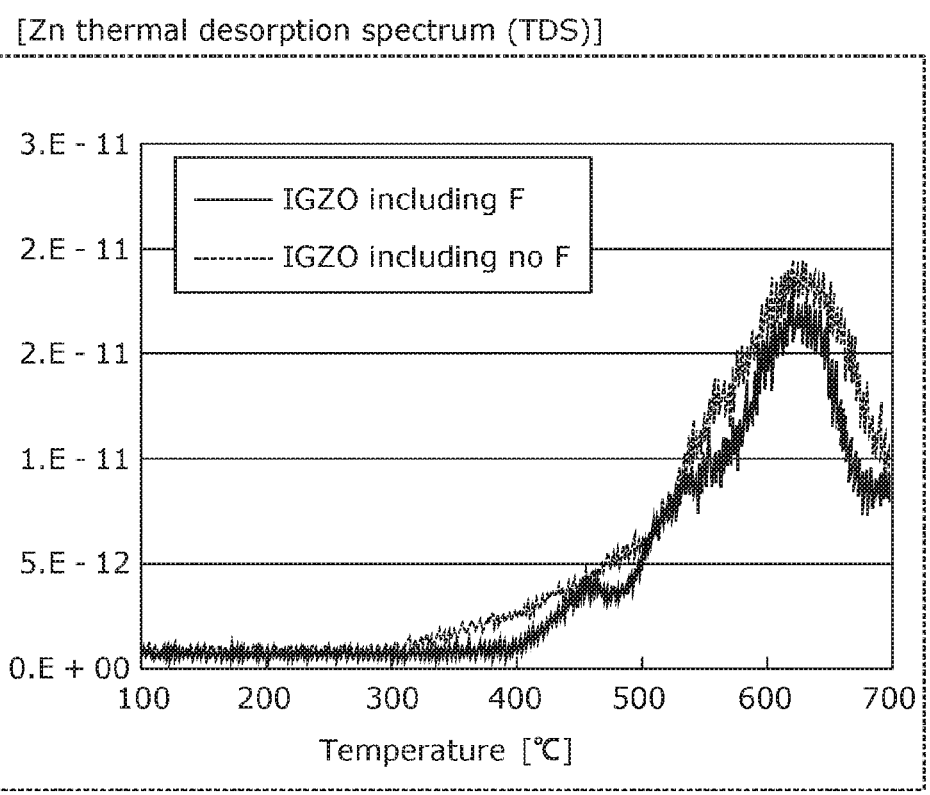
FIG. 8 is a graph illustrating a Zn thermal desorption spectrum by TDS in a case where fluorine is included in an oxide semiconductor layer, and a Zn thermal desorption spectrum by TDS in a case where fluorine is not included in the oxide semiconductor layer.

FIG. 8 illustrates a Zn thermal desorption spectrum by thermal desorption spectrometry (TDS) in a case where fluorine is included in the oxide semiconductor layer 50 (IGZO) (IGZO including F) and a Zn thermal desorption spectrum by TDS in a case where fluorine is not included therein (IGZO including no F). It is to be noted that in FIG. 8 the oxide semiconductor layer 50 in the case where fluorine is included therein has a fluorine concentration of $1 \times 10^{22}$ atm/cm$^3$ or more. Moreover, in FIG. 8, the horizontal axis indicates a temperature (° C.) at which Zn undergoes thermal desorption, and the vertical axis indicates an amount of Zn undergoing thermal desorption (arbitrary unit).

As illustrated by FIG. 8, it is clear that the thermal desorption of Zn in the oxide semiconductor layer 50 (IGZO including F) in the case where fluorine is included therein occurs at a temperature higher by at least 50° C. in comparison to the thermal desorption of Zn in the oxide semiconductor layer 50 (IGZO including no F) in the case where fluorine is not included therein. In other words, it is clear that including fluorine in the oxide semiconductor layer 50 so that the fluorine concentration is at least $1 \times 10^{22}$ atm/cm$^3$ causes the temperature (thermal desorption temperature) at which Zn undergoes the thermal desorption to increase by 50° C.

This is because oxygen desorbs from Zn—O bonds to destabilize Zn, which causes the desorption of Zn. A thermal desorption temperature can be used as a physical property index of an oxide semiconductor layer, and an increase in the thermal desorption temperature indicates that a structure of the oxide semiconductor layer is stabilized.

As just described, also from the standpoint of the thermal desorption temperature of Zn, including fluorine in the oxide semiconductor layer 50 results in the metallic elements included in the oxide semiconductor layer 50 being chemically bonded with fluorine, which makes it possible to stabilize the structure of the oxide semiconductor layer 50.

Figure 9:
FIG. 9 is a diagram illustrating a process for introducing fluorine into an oxide semiconductor layer (IGZO).
Figure 9:
Figure 9:
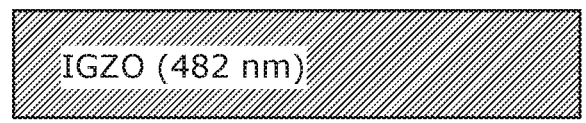
Figure 9:
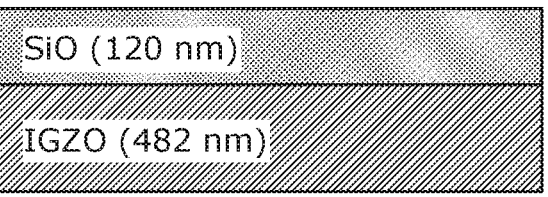
Figure 9:
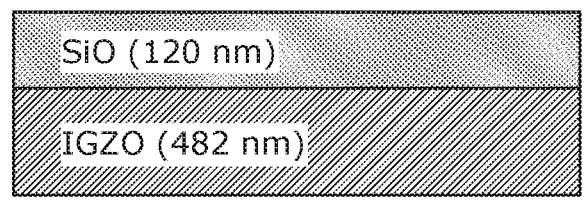

Next, a point that the oxide semiconductor layer 50 has a fluorine concentration gradient will be described with reference to FIGS. 9 and 10. FIG. 9 is a diagram illustrating a method for producing a sample used in the experiment, and shows a process for introducing fluorine into an oxide semiconductor layer (IGZO film).

Specifically, first, as illustrated by (a) in FIG. 9, an IGZO film (oxide semiconductor film) having a film thickness of 482 nm is deposited by sputtering. This IGZO film corresponds to the oxide semiconductor layer 50 in the aforementioned embodiment.

Next, as illustrated by (b) in FIG. 9, NF$_3$ processing (fluorine processing) is performed on the IGZO film. Specifically, NF$_3$ plasma processing is performed at 100 W for 60 seconds.

Next, as illustrated by (c) in FIG. 9, a SiO film (silicon oxide film) is deposited on the IGZO film by plasma CVD. This SiO film corresponds to the protective layer 60 in the aforementioned embodiment.

Next, annealing is performed at a predetermined temperature for a predetermined time. Specifically, the annealing is performed at 350° C. for one hour. This annealing corresponds to the process for stabilizing the characteristics of the oxide semiconductor layer 50 in the aforementioned embodiment.

A fluorine concentration distribution of the sample thus obtained is analyzed by secondary ion mass spectrometry (SIMS). FIG. 10 shows the results of the analysis and is a graph obtained by measuring a fluorine concentration in a thickness (depth) direction by SIMS and plotting the measured fluorine concentration.

Figure 10:
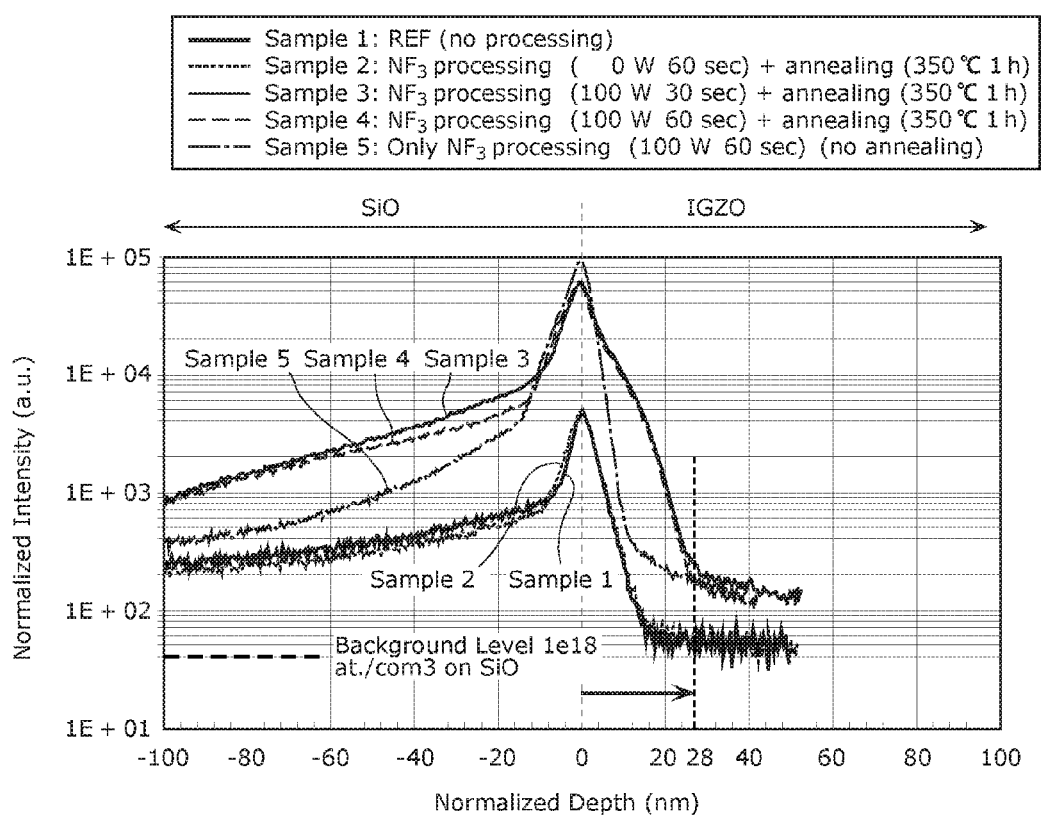
FIG. 10 is a graph illustrating a fluorine concentration distribution in a stacked structure of the oxide semiconductor layer formed by the process in FIG. 9 and a silicon oxide film.

As illustrated by FIG. 10, in the experiment, samples having the structure illustrated by FIG. 9 are produced under five conditions and are referred to as samples 1 to 5, respectively. Specifically, "sample 1" is produced without performing the NF$_3$ processing illustrated by (b) in FIG. 9 and the annealing illustrated by (d) in FIG. 9. "Sample 2" is produced by performing not the NF$_3$ processing but only the annealing. "Sample 3" is produced by performing the plasma NF$_3$ processing (100 W, 30 seconds) and the annealing (350° C., one hour). "Sample 4" is produced by performing the plasma NF$_3$ processing (100 W, 60 seconds) and the annealing (350° C., one hour). "Sample 5" is produced by performing not the annealing but the plasma NF$_3$ processing (100 W, 60 seconds).

It is clear from the results shown in FIG. 10 that the IGZO film (oxide semiconductor layer 50) has the fluorine concentration gradient in the depth direction (thickness direction). In particular, it is clear that fluorine diffuses so that the IGZO film has the concentration gradient within about 28 nm in the depth direction from a surface of the IGZO film. In this case, since a comparison of samples 3 and 4 shows that the IGZO film has the same fluorine concentration gradient, it is clear that a diffusion amount of fluorine is saturated in sample 3.

Moreover, a comparison of samples 3 and 4 and sample 5 clearly shows that fluorine diffuses in the IGZO film due to the annealing. It is to be noted that a comparison of samples 3 and 4 and sample 5 clearly shows that fluorine diffuses in the SiO film due to the annealing.

Fluorine is included in the oxide semiconductor layer 50 in the thin film transistor 1 according to the embodiment. With this, as mentioned above, not only the oxygen deficiency in the oxide semiconductor layer 50 can be compensated, but also the hydrogen resistance of the oxide semiconductor layer 50 can be improved, and further the structure of the oxide semiconductor layer 50 can be stabilized.

The thin film transistor 1 in the embodiment has a bottom gate structure, and fluorine is included in the region that is the internal region in the oxide semiconductor layer 50 and is close to the gate insulating layer 40. Specifically, fluorine is included in the first region 51 which is the region on the front channel side of the oxide semiconductor layer 50.

With this, the front channel region in the oxide semiconductor layer 50 can be made less susceptible to the damage resulting from hydrogen or oxygen, and the structure of the oxide semiconductor layer 50 can be stabilized. Accordingly, it is possible to obtain the oxide semiconductor layer 50 having the stable channel region.

Moreover, in the thin film transistor 1 in the embodiment, the source electrode 70S and the drain electrode 70D have the top contact structure and are connected to an upper portion of the oxide semiconductor layer 50. In addition, the region close to the gate insulating layer 40 in the oxide semiconductor layer 50 has the fluorine concentration higher than that of a contact region for the source electrode 70S or the drain electrode 70D in the oxide semiconductor layer 50. Specifically, the first region 51 has the fluorine concentration higher than that of the second region 52 in the oxide semiconductor layer 50.

With this, resistance on the back channel side can be lower than resistance on the front channel side in the oxide semiconductor layer 50. In other words, contact resistance of the source contact portion and the drain contact portion in the oxide semiconductor layer 50 can be reduced.

Thus, the thin film transistor 1 according to the embodiment makes it possible to both stabilize the channel region and reduce the contact resistance in the oxide semiconductor layer 50. As a result, it is possible to achieve the thin film transistor having high reliability.

Moreover, in the embodiment, in the first region 51 (region including fluorine), a region on the side of the gate insulating layer 40 has a fluorine concentration higher than that of a region on the side opposite the gate insulating layer 40.

With this structure, in the oxide semiconductor layer 50, not only a more stable channel region can be achieved, but also the contact resistance of the source contact portion and the drain contact portion can be further reduced.

In addition, the fluorine concentration of the first region 51 (region including fluorine) gradually increases toward the gate insulating layer 40. To put it differently, the fluorine concentration of the first region 51 (region including fluorine) gradually decreases away from the gate insulating layer 40.

With this structure, it is possible to both stabilize the channel region and reduce the contact resistance in the oxide semiconductor layer 50.

[Display Device]

Figure 11:
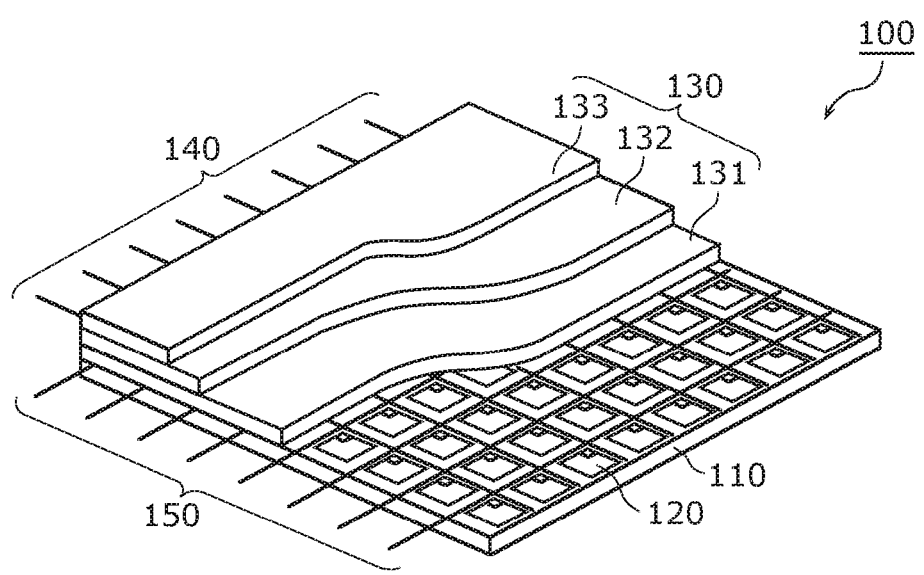
FIG. 11 is a cutaway perspective view illustrating part of an organic EL display device according to the embodiment.
Figure 12:
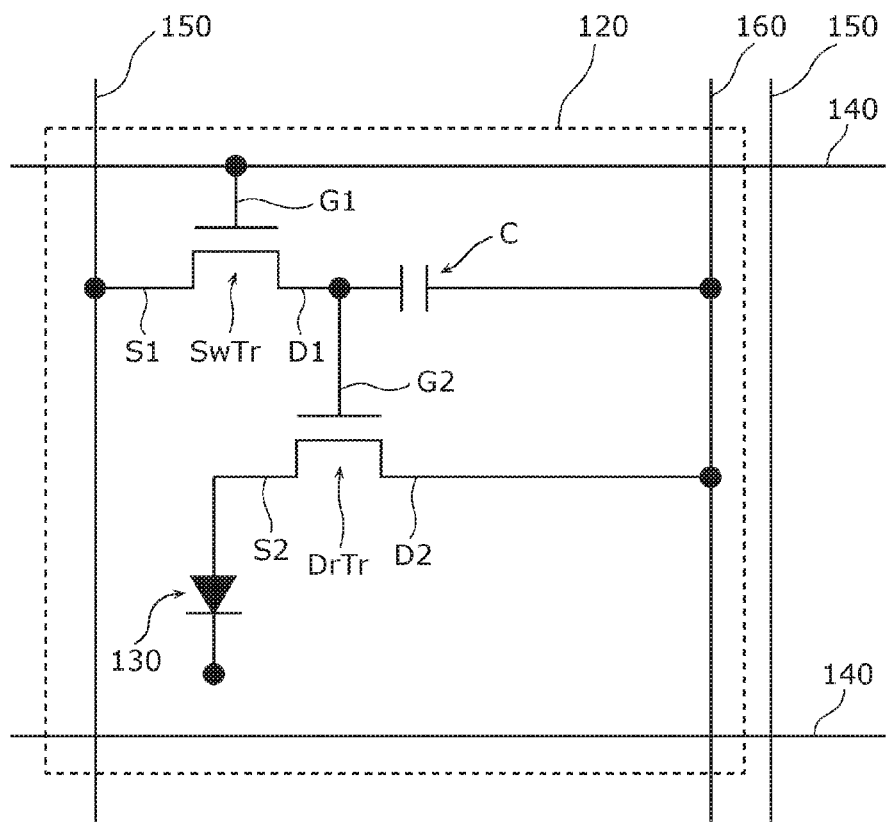
FIG. 12 is an electric circuit diagram illustrating a pixel circuit of the organic EL display device illustrated by FIG. 11.

The following describes an example where the thin film transistor 1 according to the aforementioned embodiment is applied to a display device, with reference to FIGS. 11 and 12. It is to be noted that an example of application to an organic EL display device will be described in the embodiment.

FIG. 11 is a cutaway perspective view illustrating part of an organic EL display device according to the embodiment. FIG. 12 is an electric circuit diagram illustrating a pixel circuit of the organic EL display device illustrated by FIG. 11. It is to be noted that the pixel circuit is not limited to the configuration illustrated by FIG. 12.

The above-mentioned thin film transistor 1 can be used as a switching transistor SwTr and a driving transistor DrTr of an active matrix substrate in the organic EL display device.

As illustrated by FIG. 11, an organic EL display device 100 includes a stacked structure of: a TFT substrate (TFT array substrate) 110 in which thin film transistors are disposed; and organic EL elements (light-emitting units) 130 each including an anode 131 which is a lower electrode (reflecting electrode), and a cathode 133 which is an EL layer (light-emitting layer) 132 and an upper electrode (transparent electrode).

The TFT substrate 110 in the embodiment includes the above-mentioned thin film transistor 1. Pixels 120 are arranged in a matrix in the TFT substrate 110, and a pixel circuit is included in each pixel 120.

Each of the organic EL elements 130 is formed corresponding to a different one of the pixels 120, and light emission of the organic EL element 130 is controlled by the pixel circuit included in the corresponding pixel 120. Each organic EL element 130 is formed on an interlayer insulating layer (planarizing layer) formed to cover thin film transistors.

Moreover, the organic EL element 130 has a configuration in which the EL layer 132 is disposed between the anode 131 and the cathode 133. Furthermore, a hole transport layer is formed stacked between the anode 131 and the EL layer 132, and an electron transport layer is formed stacked between the EL layer 132 and the cathode 133. It is to be noted that other function layers may be formed between the anode 131 and the cathode 133. In addition to the EL layer 132, a function layer to be formed between the anode 131 and the cathode 133 is an organic layer including an organic material.

Each pixel 120 is driven and controlled by a corresponding one of the pixel circuits. Moreover, in the TFT substrate 110, gate lines (scanning lines) 140 are disposed along the row direction of the pixels 120, source lines (signal lines) 150 are disposed along the column direction of the pixels 120 to cross the gate lines 140, and power supply lines (not illustrated in FIG. 11) are disposed parallel to the source lines 150. The pixels 120 are partitioned from one another by, for example, the crossing gate lines 140 and source lines 150.

The gate lines 140 are connected, on a row by row basis, to the gate electrodes of the switching transistors included in the respective pixel circuits. The source lines 150 are connected, on a column by column basis, to the source electrodes of the switching transistors. The power supply lines are connected, on a column by column basis, to the drain electrodes of the driving transistors included in the respective pixel circuits.

As illustrated by FIG. 12, the pixel circuit includes the switching transistor SwTr, the driving transistor DrTr, and a capacitor C which stores data to be displayed by a corresponding one of the pixels 120. In the embodiment, the switching transistor SwTr is a TFT for selecting the pixel 120, and the driving transistor DrTr is a TFT for driving the organic EL element 130.

The switching transistor SwTr includes: a gate electrode G1 connected to the gate line 140; a source electrode S1 connected to the source line 150; a drain electrode D1 connected to the capacitor C and a gate electrode G2 of a second thin film transistor DrTr; and an oxide semiconductor layer (not illustrated). When a predetermined voltage is applied to the gate line 140 and the source line 150 connected to the switching transistor SwTr, the voltage applied to the source line 150 is held as data voltage in the capacitor C.

The driving transistor DrTr includes: the gate electrode G2 connected to the drain electrode D1 of the switching transistor SwTr and the capacitor C; a drain electrode D2 connected to the power supply line 160 and the capacitor C; a source electrode S2 connected to the anode 131 of the organic EL element 130; and an oxide semiconductor layer (not illustrated). The driving transistor DrTr supplies current corresponding to data voltage held in the capacitor C from the power supply line 160 to the anode 131 of the organic EL element 130 via the source electrode S2. With this, in the organic EL element 130, drive current flows from the anode 131 to the cathode 133, which causes the EL layer 132 to emit light.

It is to be noted that the organic EL display device 100 having the above-described configuration uses an active-matrix system in which display control is performed for each pixel 120 at a cross-point between the gate line 140 and the source line 150. With this, the switching transistor SwTr and the driving transistor DrTr in each pixel 120 cause the corresponding organic EL element 130 to selectively emit light, and thus a desired image is displayed.

As above, the organic EL display device 100 in the embodiment uses, as the switching transistor SwTr and the driving transistor DrTr, the thin film transistor 1 having high reliability and high robustness, and thus it is possible to achieve an organic EL display device having superior reliability. In particular, the thin film transistor 1 is used as the driving transistor DrTr driving the organic EL element 130, and thus it is possible to achieve an organic EL display device having superior display performance.

[Other Variations Etc.]

As shown above, a thin-film transistor and a method for manufacturing the same have been described based on the aforementioned embodiment, but the present invention is not limited to the embodiment.

For example, the amorphous oxide semiconductor of $InGaZnO_x$ (IGZO) is used as the oxide semiconductor for use in the oxide semiconductor layer in the aforementioned embodiment, but the present invention is not limited to this. An oxide semiconductor including In such as a polycrystalline oxide semiconductor like InGaO can be used.

Moreover, the aforementioned embodiment has described the organic EL display device as the display device including the thin film transistor, but the present invention is not limited to this. For example, the thin film transistor according to the aforementioned embodiment can be applied to another display device such as a liquid crystal display device.

In this case, the organic EL display device (organic EL panel) can be used as a flat panel display. For example, the organic EL display device can be used as a display panel of any electronic device such as a television set, a personal computer, and a cellular phone.

Moreover, the scope of the present invention includes an embodiment obtained by adding various modifications to each embodiment or variation that may be conceived by those skilled in the art or an embodiment obtained by arbitrarily combining components and functions of the embodiment or variation without departing from the spirit of the present invention.

INDUSTRIAL APPLICABILITY

The thin film transistor according to the present invention can be widely used in a variety of electric equipment including the thin film transistor, such as display devices (display panels) like organic EL display devices, television sets, personal computers, and cellular phones.

The invention claimed is:

1. A method for manufacturing a thin film transistor, the method comprising:
    forming a gate electrode;
    forming a gate insulating layer above the gate electrode;
    forming an oxide semiconductor layer including fluorine above the gate insulating layer; and
    forming a source electrode and a drain electrode above the oxide semiconductor layer to be electrically connected to the oxide semiconductor layer,
    wherein metallic elements included in the oxide semiconductor layer include at least indium,
    fluorine is included in a region which is an internal region in the oxide semiconductor layer and is close to the gate insulating layer, and
    a fluorine concentration of the region close to the gate insulating layer in the oxide semiconductor layer is higher than a fluorine concentration of a contact region for the source electrode or the drain electrode in the oxide semiconductor layer.

2. The method according to claim 1,
    wherein a fluorine concentration of the oxide semiconductor layer is higher than at least a hydrogen concentration of the oxide semiconductor layer.

3. The method according to claim 1,
    wherein the metallic elements included in the oxide semiconductor layer further include at least one or both of gallium and zinc.

4. The method according to claim 1,
    wherein the region including fluorine in the oxide semiconductor layer has a film thickness of at least 20 nm.

5. The method according to claim 1,
    wherein the region including fluorine in the oxide semiconductor layer has a film thickness of at least 5 nm.

6. The method according to claim 1,
    wherein fluorine is introduced into the oxide semiconductor layer using a gas including fluorine.

7. The method according to claim 1,
    wherein in the region including fluorine in the oxide semiconductor layer, a fluorine concentration of a region on a side of the gate insulating layer is higher than a fluorine concentration of a region on a side opposite the gate insulating layer.

8. The method according to claim 7,
    wherein the fluorine concentration of the region including fluorine in the oxide semiconductor layer gradually increases toward the gate insulating layer.

9. A thin film transistor comprising:
    a gate electrode;
    a gate insulating layer disposed above the gate electrode;
    an oxide semiconductor layer disposed above the gate insulating layer; and
    a source electrode and a drain electrode electrically connected to the oxide semiconductor layer,
    wherein metallic elements included in the oxide semiconductor layer include at least indium, fluorine is included in a region which is an internal region in the oxide semiconductor layer and is close to the gate insulating layer, and a fluorine concentration of the region close to the gate insulating layer in the oxide semiconductor layer is higher than a fluorine concentration of a contact region for the source electrode or the drain electrode in the oxide semiconductor layer.

10. An organic EL display device including the thin film transistor according to claim 9, the organic EL display device comprising:

pixels arranged in a matrix; and organic EL elements each formed corresponding to a different one of the pixels, wherein the thin film transistor is a driving transistor which drives the organic EL elements.

11. The thin film transistor according to claim 9, wherein a fluorine concentration of the oxide semiconductor layer is higher than at least a hydrogen concentration of the oxide semiconductor layer.

12. The thin film transistor according to claim 9, wherein the metallic elements included in the oxide semiconductor layer further include at least one or both of gallium and zinc.

13. The thin film transistor according to claim 9, wherein the region including fluorine in the oxide semiconductor layer has a film thickness of at least 20 nm.

14. The thin film transistor according to claim 9, wherein the region including fluorine in the oxide semiconductor layer has a film thickness of at least 5 nm.

15. The thin film transistor according to claim 9, further comprising a protective layer formed on the oxide semiconductor layer.

16. The thin film transistor according to claim 9, wherein in the region including fluorine in the oxide semiconductor layer, a fluorine concentration of a region on a side of the gate insulating layer is higher than a fluorine concentration of a region on a side opposite the gate insulating layer.

17. The thin film transistor according to claim 16, wherein the fluorine concentration of the region including fluorine in the oxide semiconductor layer gradually increases toward the gate insulating layer.

* * * * *